United States Patent
Sasaki et al.

(10) Patent No.: US 6,840,781 B2
(45) Date of Patent: Jan. 11, 2005

(54) STRUCTURE FOR MOUNTING CONNECTOR ON BOARD

(75) Inventors: Harehide Sasaki, Aichi (JP); Yoshiaki Kato, Aichi (JP); Keiichi Ito, Aichi-ken (JP); Masato Minakata, Toyota (JP); Atsushi Nishida, Toyota (JP)

(73) Assignee: Kabushiki Kaisha Tokai Rika Denki Seisakusho, Aichi (JP)

( * ) Notice: Subject to any disclaimer, the term of this patent is extended or adjusted under 35 U.S.C. 154(b) by 0 days.

(21) Appl. No.: 10/626,262

(22) Filed: Jul. 24, 2003

(65) Prior Publication Data

US 2004/0072455 A1 Apr. 15, 2004

(30) Foreign Application Priority Data

Jul. 25, 2002 (JP) .......................................... 2002-217083

(51) Int. Cl.[7] .................................................. H01R 9/09
(52) U.S. Cl. ........................................................ 439/83
(58) Field of Search ............................... 439/81–84, 79, 439/82; 174/265, 266, 267, 262; 361/772–774, 803, 743; 257/734; 29/838

(56) References Cited

U.S. PATENT DOCUMENTS

| 4,737,114 A | 4/1988 | Yaegashi |
| 4,834,662 A * | 5/1989 | Schempp et al. .............. 439/83 |
| 5,122,075 A | 6/1992 | Kile |
| 5,273,203 A | 12/1993 | Webster |
| 5,823,830 A | 10/1998 | Wurster |
| 5,915,999 A | 6/1999 | Takenaka et al. |
| 6,011,222 A * | 1/2000 | Sekiya et al. ................ 174/266 |
| 6,052,895 A | 4/2000 | Bianca et al. |
| 6,234,834 B1 * | 5/2001 | Tsai et al. ................. 439/541.5 |
| 6,552,277 B1 * | 4/2003 | Downes ....................... 174/267 |

FOREIGN PATENT DOCUMENTS

| EP | 0 287 870 A2 | 10/1988 |
| EP | 0 335 420 A2 | 10/1989 |
| GB | 1 426 264 | 2/1976 |

* cited by examiner

*Primary Examiner*—Alex Gilman
(74) *Attorney, Agent, or Firm*—Patterson, Thuente, Skaar & Christensen, P.A.

(57) ABSTRACT

A connector has terminals, each having a tip end portion. A wiring board has through holes. A land is provided on the wiring board about each through hole. When the connector is mounted on the wiring board, each terminal is connected to one of the lands with a part of the tip end portion being located in the corresponding through hole. The ratio of the cross-sectional area of each tip end portion to the cross-sectional area of each through hole is at least 0.11 and no more than 0.89. This improves the reliability of the joint portions between the terminals and the wiring board.

14 Claims, 6 Drawing Sheets

STRUCTURE FOR MOUNTING CONNECTOR ON BOARD

BACKGROUND OF THE INVENTION

The present invention relates to a connector mounted on a board.

A conventional connector 60 shown in FIGS. 8 and 9 has a housing 61 and a plurality of connecting terminals 62 extending from the housing 61. The connector 60 can be mounted by soldering on a wiring board 63 having a plurality of through holes 64, which is shown in FIGS. 8 and 9. Each of the connecting terminals 62 of the connector 60 having been mounted on the wiring board 63 is inserted in one of the through holes 64.

The connector 60 can be used as an automobile part. The connector 60 used as an automobile part has been required to be smaller in size in recent years. To meet this requirement, there is a tendency to decrease not only for the size of the connecting terminal 62 but also to decrease the pitch A1 between the adjacent connecting terminals 62. The connector 60 used as an automobile part has also been required to have very high environment resistance, i.e., thermal shock resistance. This is because automobile parts are exposed to harsh environments, such as blazing sun and extreme cold.

When the pitch A1 between the adjacent connecting terminals 62 is decreased, it is necessary to decrease the size of a land 65 provided on the wiring board 63. However, when the connector 60 is subjected to a thermal shock, a decrease in the size of the land 65 easily produces a crack in a solder portion 66 in which the connecting terminal 62 connects with the wiring board 63. That is to say, the reliability of the solder portion 66 decreases. A crack is liable to be produced especially when the wiring board 63 on which the connector 60 is mounted is what is called a one side board having the land 65 only on one side (see FIG. 10). The reason why the crack is produced is presumed to be that thermal stress is applied to the solder portion 66 by a difference between the coefficient of thermal expansion of the connecting terminal 62 and that of the wiring board 63.

SUMMARY OF THE INVENTION

Accordingly, it is an objective of the present invention to provide a structure for mounting a connector on a board, which structure being capable of increasing the reliability of a joint portion between a connecting terminal and a board.

To achieve the foregoing and other objectives and in accordance with the purpose of the present invention, a structure for mounting a connector on a board is provided. The connector includes a terminal that has a tip end portion and a remainder portion. The board has a receiving hole. A land is provided in a section of the board about the receiving hole. The terminal is connected to the land with at least a part of the tip end portion being located in the receiving hole. The ratio of the cross-sectional area of the tip end portion to the cross-sectional area of the receiving hole is at least 0.11 and no more than 0.89.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

One embodiment of the present invention will now be described with reference to FIGS. 1 to 7.

Figure 1:
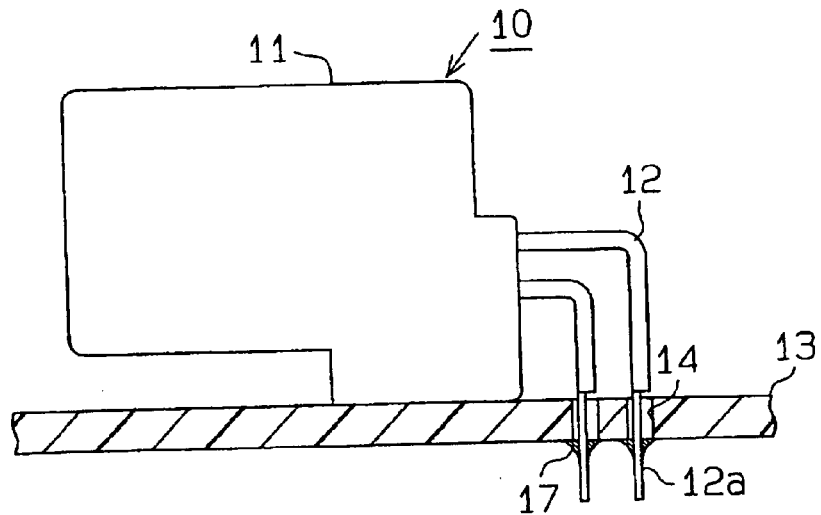
FIG. 1 is a side view of a connector in accordance with one embodiment of the present invention which is mounted on a wiring board.
Figure 2:
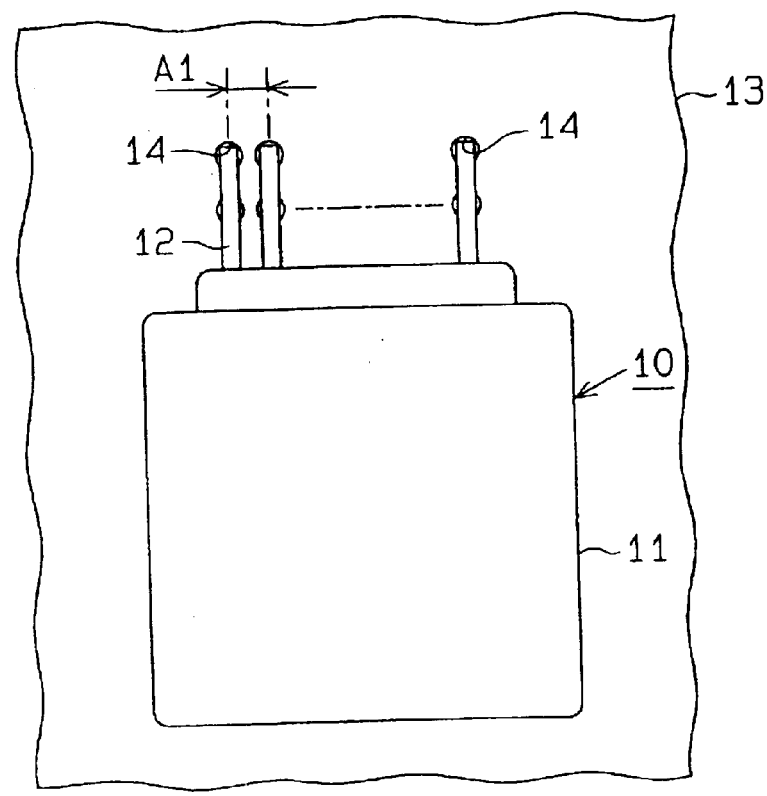
FIG. 2 is a plan view of the mounted connector shown in FIG. 1.

A connector 10 shown in FIGS. 1 and 2 has a synthetic resin made housing 11 and a plurality of metal made connecting terminals 12. An opening (not shown) is formed in one side surface (left-hand side surface in FIG. 1) of the housing 11, and the connecting terminals 12 extend in an L shape from the surface of the housing 11, which is opposite to the surface in which the opening is formed (right-hand side surface in FIG. 1). That is to say, the connector 10 is what is called a horizontal type connector. The connecting terminals 12 are arranged in two rows. Each row includes ten connecting terminals 12. The pitch A1 between the adjacent connecting terminals 12 on the same row, i.e., the center-to-center distance between the adjacent connecting terminals 12 is about 2.2 mm.

Figure 3:
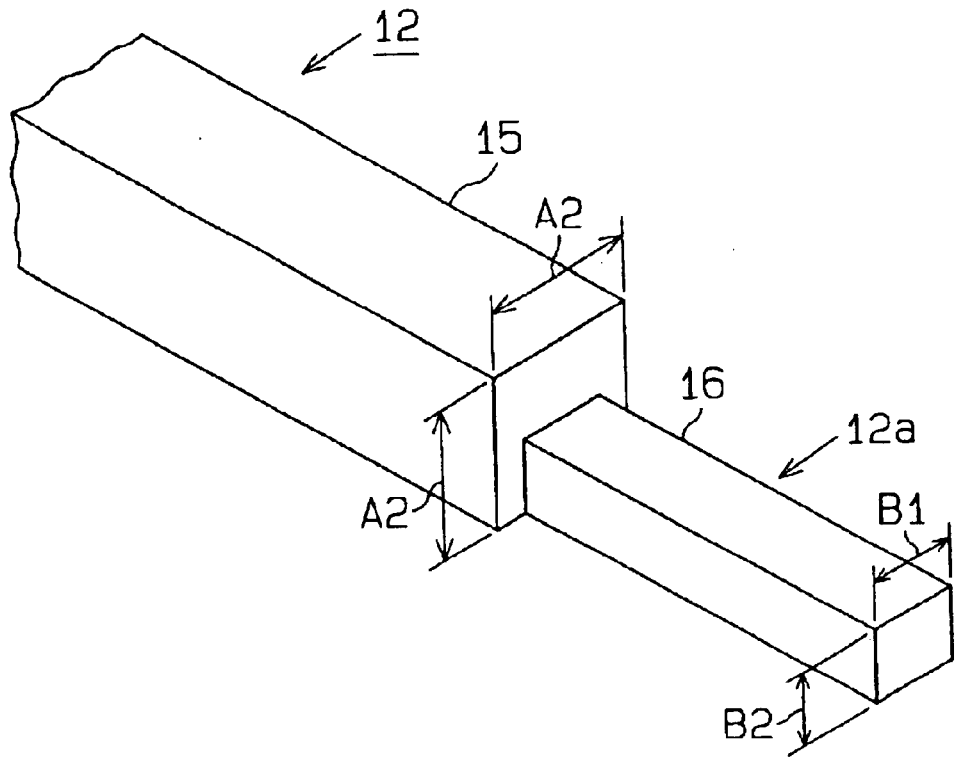
FIG. 3 is a perspective view showing a part of a connecting terminal for the connector shown in FIG. 1.
Figure 4:
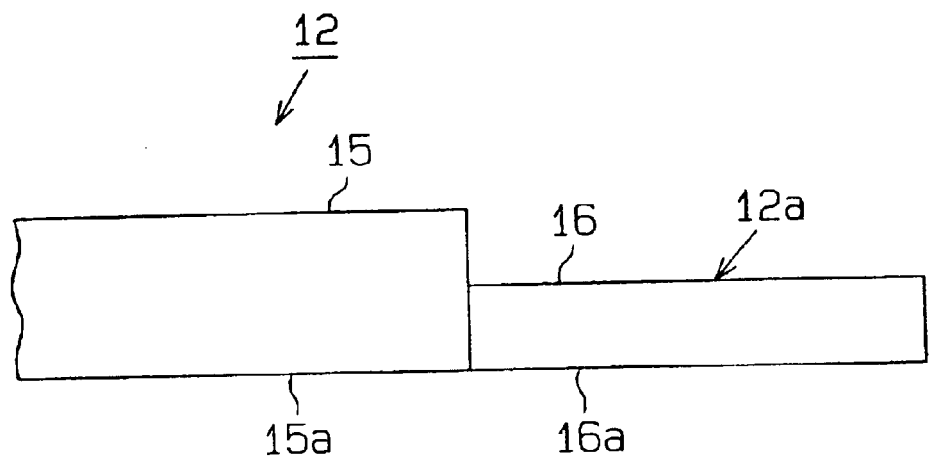
FIG. 4 is a side view showing a part of the connecting terminal shown in FIG. 3.

As shown in FIGS. 3 and 4, a tip end portion 12a of each of the connecting terminals 12 is slenderer than a remainder portion of the connecting terminal 12 (the portion other than the tip end portion 12a). In other words, the connecting terminal 12 has a thick portion 15 and a thin portion 16 extending from the tip end of the thick portion 15. A one side surface 16a (lower surface in FIG. 4) of the thin portion 16 is flush with a one side surface 15a (lower surface in FIG. 4) of the corresponding thick portion 15. The connecting terminal 12 is formed by blanking a metallic sheet, such as a brass sheet, having two portions with a different thickness into a square bar shape. The metallic sheet having two portions with a different thickness is formed by rolling a part of metallic sheet having a uniform thickness.

The cross section of the thick portion 15 is a square having a one-side length A2 of 0.025 inch (about 0.64 mm). For this reason, the connector 10 is called a "025 connector". The cross section of the thin portion 16 is a rectangle having a first side length B1 and a second side length B2 of at least 0.3 mm and no more than 0.5 mm. Therefore, the cross-sectional area T2 (see FIG. 6) of the thin portion 16 is at least 0.09 mm$^2$ and no more than 0.25 mm$^2$. If the length B1, B2 of each side is shorter than 0.3 mm, the thin portion 16 is difficult to manufacture. If the length B1, B2 of each side is longer than 0.5 mm, the thin portion 16 is difficult to insert into a through hole 14 in a wiring board 13, described later.

Figure 5:
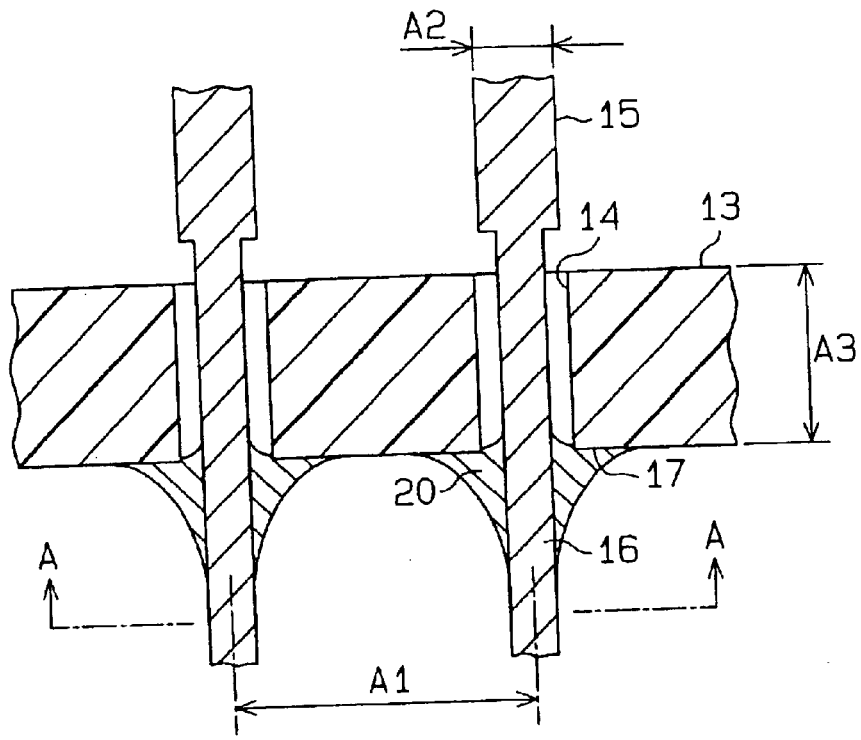
FIG. 5 is a sectional view showing a joint portion between the connecting terminal shown in FIG. 3 and a wiring board.
Figure 6:
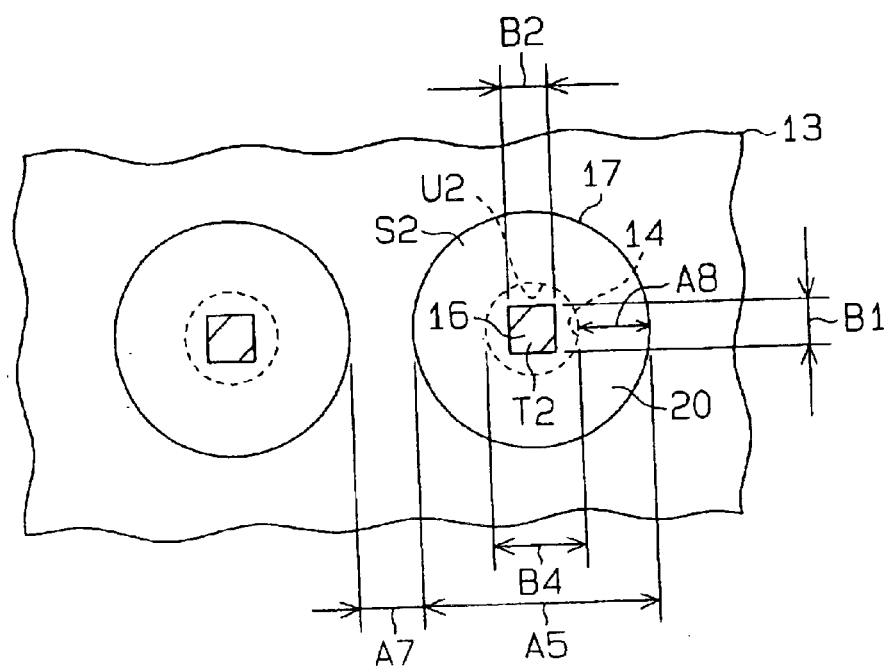
FIG. 6 is a view taken in the direction of the arrows along the line A—A of FIG. 5.

The connector 10 can be mounted by soldering on the wiring board 13 shown in FIGS. 1 and 2. The wiring board 13 has a plurality of receiving holes, which are through holes 14 having a circular cross-section in this embodiment. The wiring board 13 is what is called a one side board. Specifically, as shown in FIGS. 5 and 6, the wiring board 13 has no land 17 around the through hole 14 on the surface of the wiring board 13 facing the connector 10, and has a land 17 around the through hole 14 on the surface of the wiring board 13 on the opposite side of the surface facing the connector 10.

When the connector 10 is solder mounted on the wiring board 13, the thin portion 16 of each of the connecting terminals 12 is inserted into one of the through holes 14 and is soldered to the land 17 corresponding to that through hole 14. That is to say, the thin portion 16 of each of the connecting terminals 12 is joined to the land 17 of the corresponding through hole 14 by a solder portion 20.

The through holes 14 are arranged in two rows. The center-to-center distance of the adjacent through holes 14 on the same row is about 2.2 mm, which is the same as the aforementioned pitch A1. The land 17 is of an annular shape, and the outside diameter A5 thereof is about 1.8 mm. Therefore, the clearance A7 between the adjacent lands 17 is about 0.4 mm. The inside diameter of the land 17 is equal to the diameter B4 of the through hole 14.

The diameter B4 of the through hole 14 is at least 0.6 mm and no more than 1.0 mm, preferably at least 0.75 mm and no more than 0.95 mm. If the diameter B4 of the through hole 14 is smaller than 0.6 mm, the working accuracy of the through hole 14 decreases remarkably. If the diameter B4 of the through hole 14 is larger than 1.0 mm, a large clearance is liable to be produced between the through hole 14 and the thin portion 16 of the connecting terminal 12 inserted in the through hole 14, and additionally the size S2 of the land 17 soldered to the thin portion 16 decreases.

Since the outside diameter A5 of the land 17 is about 1.8 mm, when the diameter B4 of the through hole 14 is at least 0.6 mm and no more than 1.0 mm, the width A8 of the land 17 is at least 0.4 mm and no more than 0.6 mm, and when the diameter B4 of the through hole 14 is at least 0.75 mm and no more than 0.95 mm, the width A8 of the land 17 is at least 0.43 mm and no more than 0.52 mm. Therefore, the land width A8 is preferably at least 0.4 mm and no more than 0.6 mm, further preferably at least 0.43 mm and no more than 0.52 mm. The ratio of the width A8 of each land 17 to the clearance A7 between each adjacent pair of lands 17 is preferably at least 1 and no more than 1.5. Further, the ratio of the width A8 of each land 17 to the distance between the centers of each adjacent pair of the through holes 14 is preferably at least 0.18, and no more than 0.27.

When the diameter B4 of the through hole 14 is at least 0.6 mm and no more than 1.0 mm, the hole area U2 of the through hole 14 is at least 0.28 mm$^2$ and no more than 0.79 mm$^2$. Therefore, the ratio T2/U2 of the cross-sectional area T2 of the thin portion 16 to the hole area U2 of the through hole 14 is at least 0.11 and no more than 0.89. When the diameter B4 of the through hole 14 is at least 0.75 mm and no more than 0.95 mm, since the hole area U2 of the through hole 14 is at least 0.44 mm$^2$ and no more than 0.71 mm$^2$, the ratio T2/U2 is at least 0.13 and no more than 0.57. Therefore, the ratio T2/U2 is preferably at least 0.11 and no more than 0.89, and further preferably at least 0.13 and no more than 0.57.

Hereunder, the present invention will be described in more detail by means of example and comparative example.

EXAMPLE

A connector of the example is the connector 10 shown in FIGS. 1 and 2. However, the first side length B1 in the cross section of the thin portion 16 is 0.4 mm, and the second side length B2 is 0.45 mm. Therefore, the cross-sectional area T2 of the thin portion 16 is 0.18 mm$^2$.

A wiring board of the example is the wiring board 13 shown in FIGS. 1 and 2, and is a paper phenol copper-clad laminate (manufactured by Sumitomo Bakelite Co., Ltd.) with a thickness A3 (see FIG. 5) of 1.6 mm. However, the diameter B4 of the through hole 14 is 0.8 mm. Therefore, the hole area U2 of the through hole 14 is 0.5 mm$^2$, the width A8 of the land 17 is 0.5 mm, and the size S2 of the land 17 is about 2.04 mm$^2$. Also, the ratio T2/U2 is 0.36.

COMPARATIVE EXAMPLE

A connector of the comparative example is the connector 60 shown in FIGS. 8 to 11. However, the pitch A1 between the adjacent connecting terminals 62 is 2.2 mm. The length of first and second sides, A2 in the cross section of the connecting terminal 62 is 0.64 mm. Therefore, the cross-sectional area T1 of the connecting terminal 62 is 0.41 mm$^2$.

Figure 10:
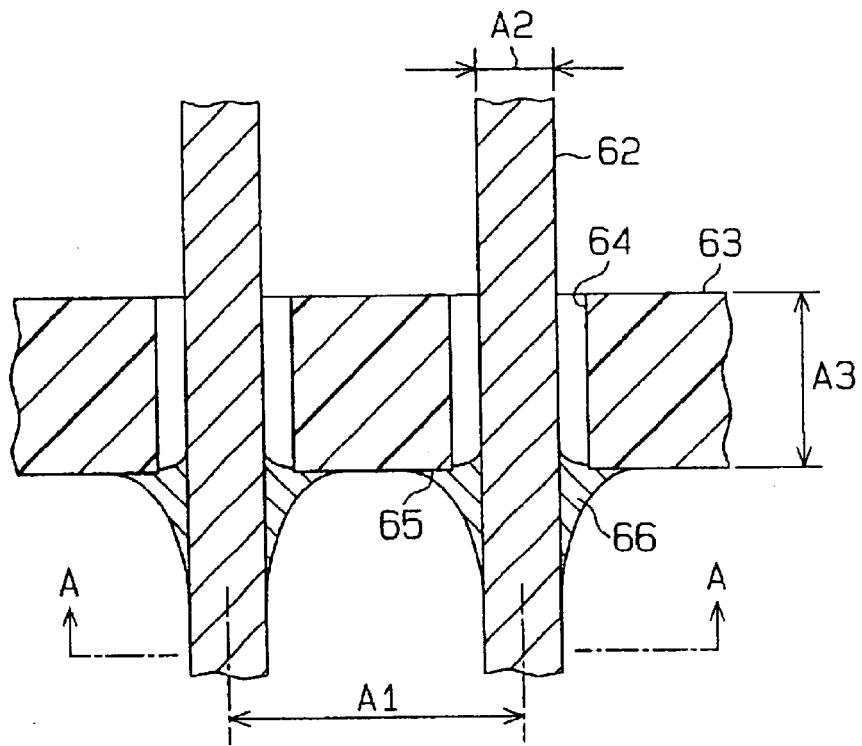
FIG. 10 is a sectional view showing a joint portion between a connecting terminal and a wiring board in comparative example.
Figure 11:
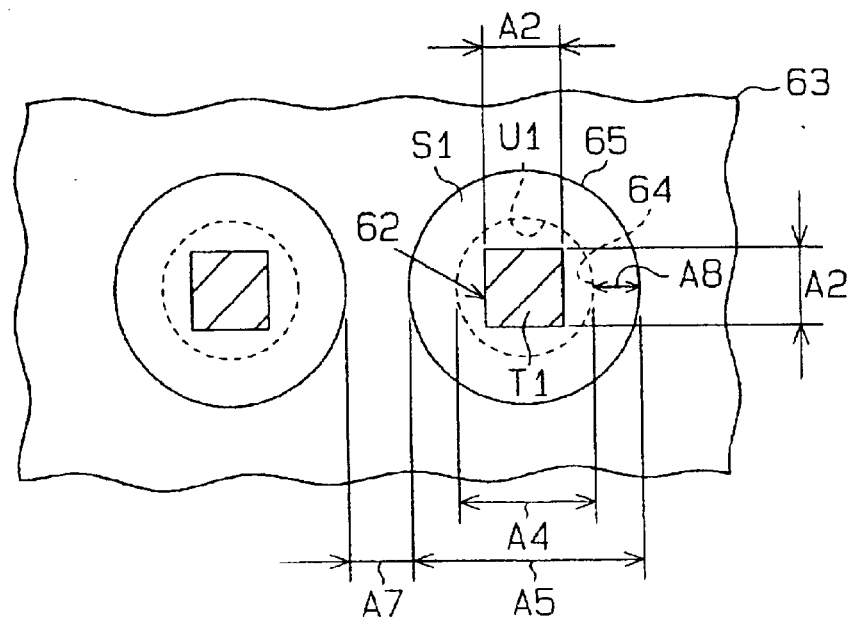
FIG. 11 is a view taken in the direction of the arrows along the line A—A of FIG. 10.

A wiring board of the comparative example is the wiring board 63 shown in FIGS. 10 and 11. The wiring board 63 is a one side board having a land 65 on one side only, and has a plurality of through holes 64. The land 65 is provided around each of the through holes 64. The diameter A4 of the through hole 64 is 1.2 mm, the center-to-center distance between the adjacent through holes 64 is 2.2 mm, and the outside diameter A5 of the land 65 is 1.8 mm. Therefore, the hole area U1 of the through hole 14 is 1.1 mm$^2$, the width A8 of the land 65 is 0.3 mm, the size S1 of the land 65 is about 1.41 mm$^2$, and the clearance A7 between the adjacent lands 65 is 0.4 mm. Also, the ratio T1/U1 of the cross-sectional area T1 of the connecting terminal 62 to the hole area U1 of the through hole 64 is 0.37.

A first specimen was prepared by solder mounting the connector of the example on the wiring board of the example, and a second specimen was prepared by solder mounting the connector of the comparative example on the wiring board of the comparative example. In order to give thermal shocks to the first and second specimens, operations in which the first and second specimens were placed in a temperature atmosphere of −30° C. for a fixed period of time, and then they were placed in a temperature atmosphere of +80° C. for a fixed period of time, were repeated in 3000 or more cycles. Subsequently, in order to evaluate the reliability of a joint portion between the connecting terminal and the wiring board in the first and second specimens, the joint strength of the joint portion was measured and the appearance thereof was observed.

Figure 7:
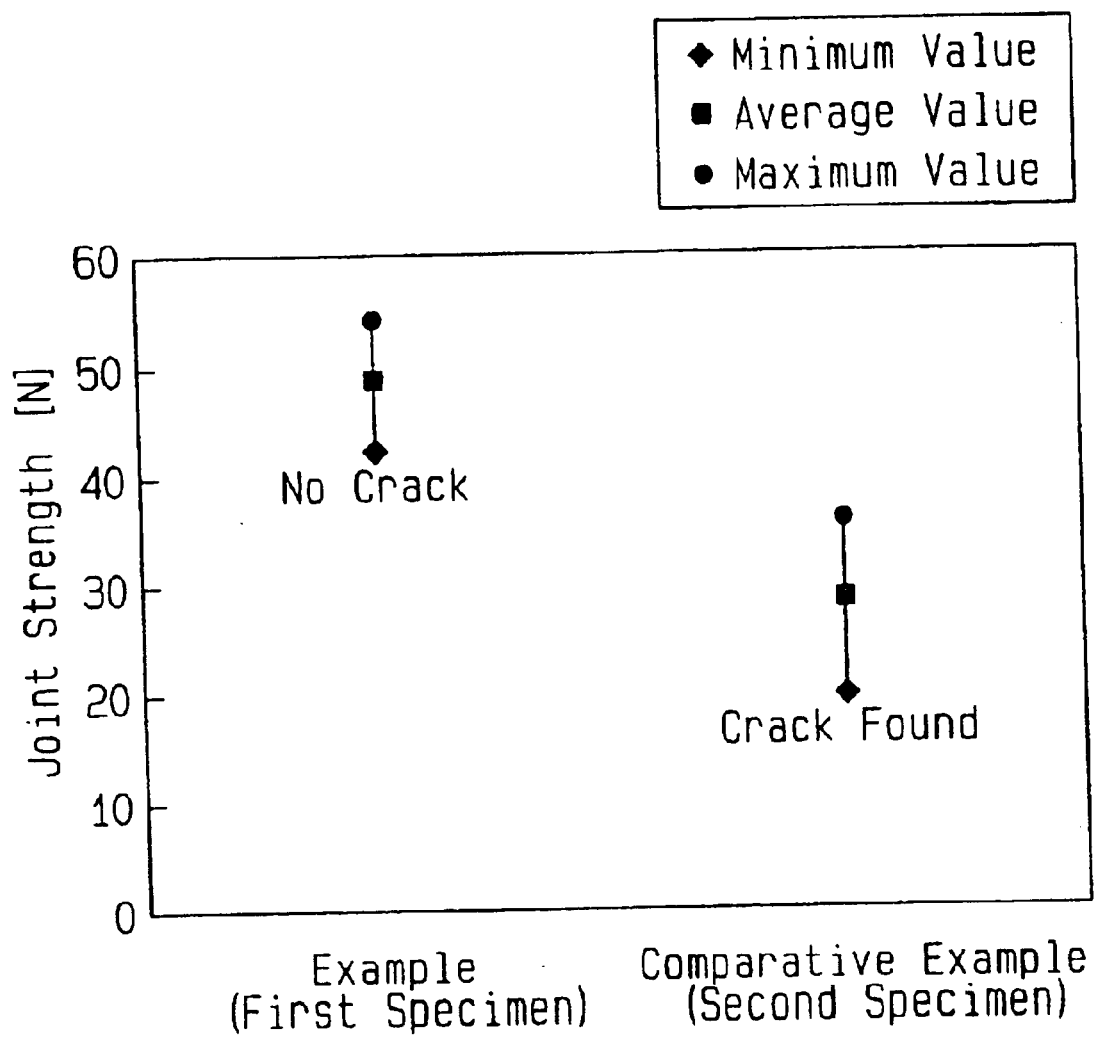
FIG. 7 is a graph showing strength of a joint portion between a connecting terminal and a wiring board in the example and the comparative example.
Figure 8:
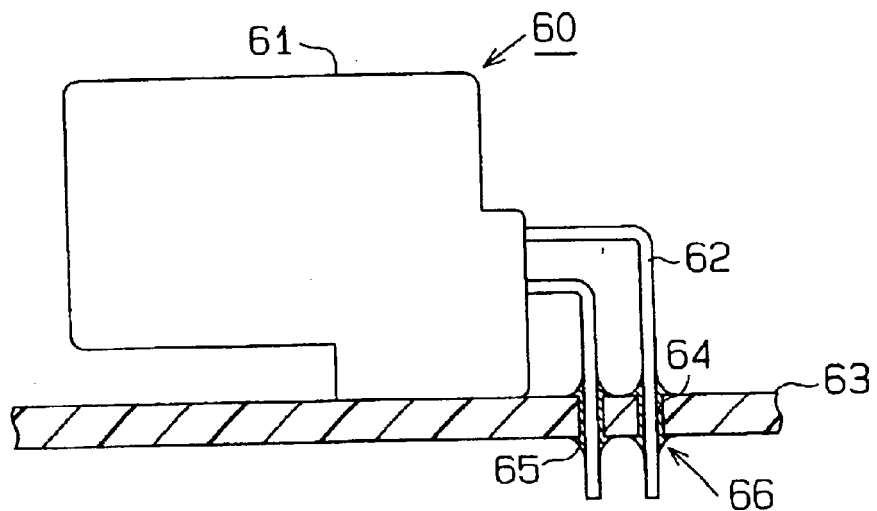
FIG. 8 is a side view of a conventional connector mounted on a wiring board.
Figure 9:
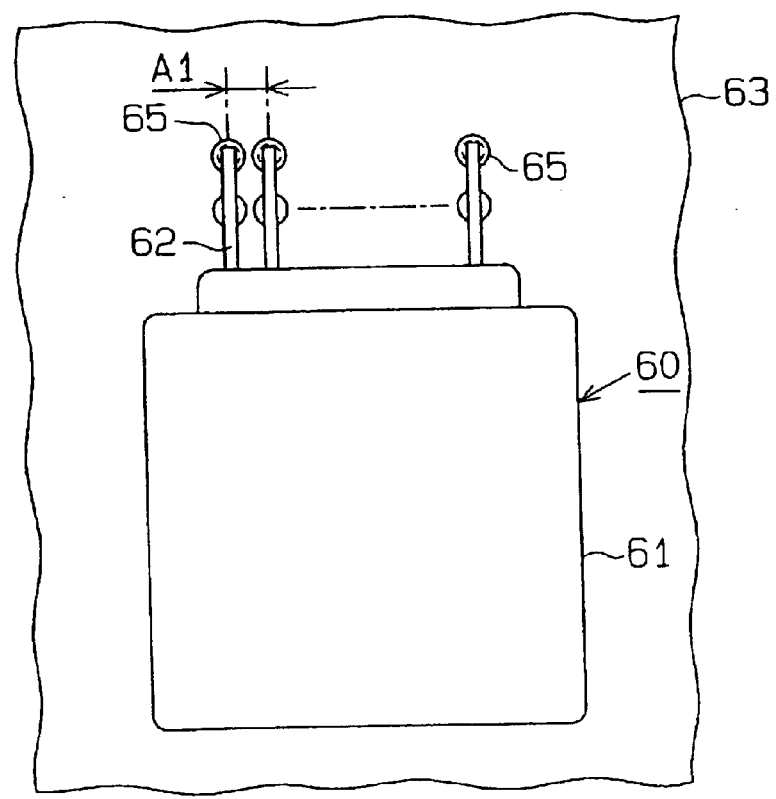
FIG. 9 is a plan view of the mounted connector shown in FIG. 8.

As shown in FIG. 7, the measured joint strength was 40 to 55 N for the first specimen (example) and 20 to 35 N for the second specimen (comparative example). Also, no crack was found in the joint portion on the first specimen (example), but a crack was found in the joint portion on the second specimen (comparative example).

This experimental result is presumed to be brought about by the fact that there is a large difference in the size of a portion of wiring board to which the connecting terminal is soldered, i.e., the size (S1, S2) of the land between the first and second specimens. The size S2 (about 2.04 mm$^2$) of the land 17 of the first specimen is about 1.45 times the size S1 (about 1.41 mm$^2$) of the land 65 of the second specimen.

The above-described embodiment of the present invention has the advantages as described below.

The ratio T2/U2 of the cross-sectional area T2 of the thin portion 16 to the hole area U2 of the through hole 14 is at least 0.11 and no more than 0.89. This means that a clearance of a sufficient size is secured between the through hole 14 and the thin portion 16 of the connecting terminal 12 inserted in the through hole 14. Therefore, this clearance sufficiently accommodates the difference between the thermal expansion of the connecting terminal 12 and that of the wiring board 13, and consequently the thermal stress applied to the solder portion 20 is relaxed. Also, since the size S2 of the land 17, which is a portion of the wiring board 13 soldered to the connecting terminal 12, is large, the joint portion between the connecting terminal 12 and the wiring board 13 has a high joint strength. Due to a synergistic effect of the relaxation of thermal stress caused by the clearance and the high joint strength that the joint portion has, a crack is very difficult to develop in the solder portion 20 at the time of thermal shock. Therefore, the reliability of the solder portion 20 is very high as compared with the conventional connector.

In the case where the ratio T2/U2 of the cross-sectional area T2 of the thin portion 16 to the hole area U2 of the through hole 14 is set at a value at least 0.13 and no more than 0.57, the clearance between the through hole 14 and the thin portion 16 of the connecting terminal 12 inserted in the through hole 14 accommodates the difference between the thermal expansion of the connecting terminal 12 and that of the wiring board 13 more reliably. Therefore, the reliability of the solder portion 20 further increases.

In the case where the width A8 of the land 17 is set at a value at least 0.4 mm and no more than 0.6 mm, the size S2 of the land 17 is secured sufficiently, so that the joint strength of the joint portion between the connecting terminal 12 and the wiring board 13 increases more reliably.

The one side surface 16a of the thin portion 16 is flush with the one side surface 15a of the corresponding thick portion 15. Therefore, the connecting terminal 12 is easy to manufacture as compared with a connecting terminal in which any of the side surfaces of the thin portion 16 is not flush with any of side surfaces of the corresponding thick portion 15.

It should be apparent to those skilled in the art that the present invention may be embodied in many other specific forms without departing from the spirit or scope of the invention. Particularly, it should be understood that the invention may be embodied in the following forms.

The connector 10 may be what is called a vertical type connector. In the vertical type connector, an opening is formed in the upper surface of the housing 11, and the connecting terminals 12 extend from the lower surface of the housing 11.

The wiring board 13 on which the connector 10 is mounted may be replaced with a so-called double side board (double-side through-hole substrate). The double side board has the land 17 around each of the through holes 14 on the surface of the wiring board 13 on the opposite side of the surface facing the connector 10, and additionally has a land around each of the through holes 14 on the surface of the wiring board 13, facing the connector 10.

The thin portion 16 of the connecting terminal 12 may be joined to the corresponding land 17 by brazing using a brazing filler metal such as copper, aluminum, nickel, gold, and silver, instead of by soldering.

The present examples and embodiments are to be considered as illustrative and not restrictive, and the invention is not to be limited to the details given herein, but may be modified within the scope and equivalence of the appended claims.

What is claimed is:

1. A structure for mounting a connector on a board, wherein the connector includes a terminal that has a tip end portion and a remainder portion, wherein the cross-section of the tip end portion is a rectangle, the length of each side of the rectangle being at least 0.3 mm and no more than 0.5 mm, wherein the board has a receiving hole, wherein the cross-section of the receiving hole is a circle, the diameter of the circle being at least 0.6 mm and no more than 1.0 mm, wherein a land is provided in a section of the board about the receiving hole, wherein the terminal is connected to the land with at least a part of the tip end portion being located in the receiving hole, and wherein the ratio of the cross-sectional area of the tip end portion to the cross-sectional area of the receiving hole is at least 0.11 and no more than 0.89.

2. The structure according to claim 1, wherein the ratio of the cross-sectional areas is at least 0.13 and no more than 0.57.

3. The structure according to claim 1, wherein the diameter of the receiving hole is at least 0.75 mm and no more than 0.95 mm.

4. The structure according to claim 1, wherein the width of the land is at least 0.4 mm and no more than 0.6 mm.

5. The structure according to claim 1, wherein the cross-sectional area of the tip end portion is at least 0.09 mm.sup.2 and no more than 0.25 mm.sup.2, and wherein the cross-sectional area of the receiving hole is at least 0.28 mm.sup.2 and no more than 0.79 mm.sup.2.

6. The structure according to claim 5, wherein the cross-sectional area of the receiving hole is at least 0.44 mm.sup.2 and no more than 0.71 mm.sup.2.

7. The structure according to claim 1, wherein the cross-sectional area of the tip end portion is less than the cross-sectional area of the remainder portion.

8. The structure according to claim 7, wherein the tip end portion has a first surface, which is a side surface, and the remainder portion has a second surface, which is also a side surface, and wherein the first surface and the second surface are flush with each other.

9. The structure according to claim 1, further comprising one or more terminals, one or more receiving holes, and one or more lands, wherein each land is provided in a section of the board about one of the receiving holes, and wherein each terminal is connected to one of the land with at least a part of the tip end portion being located in the corresponding receiving hole.

10. The structure according to claim 9, wherein the ratio of the width of each land to the clearance between each adjacent pair of the lands is at least 1 and no more than 1.5.

11. The structure according to claim 10, wherein the width of each land is at least 0.4 mm and no more than 0.6 mm.

12. The structure according to claim 9, wherein each receiving hole has a center, and wherein the ratio of the width of each land to the distance between the centers of each adjacent pair of the receiving holes is at least 0.18 and no more than 0.27.

13. The structure according to claim 12, wherein the width of each land is at least 0.4 mm and no more than 0.6 mm.

14. A structure for mounting a connector on a board, wherein the connector includes a plurality of terminals each having a tip end portion and a remainder portion, wherein the cross-sectional area of the tip end portion of each terminal is less than the cross-sectional area of the remainder portion, wherein the cross-section of the tip end portion of each terminal is a rectangle, the length of each side being at least 0.3 mm and no more than 0.5 mm, wherein the board has a plurality of receiving holes, the cross-section of each receiving hole being a circle, the diameter of the circle being at least 0.6 mm and no more than 1.0 mm, wherein a land is provided in a section of the board about each receiving hole, and wherein each terminal is connected to one of the lands with at least a part of the tip end portion being located in the corresponding receiving hole.

* * * * *